US007604865B2

(12) United States Patent
Krisko et al.

(10) Patent No.: US 7,604,865 B2
(45) Date of Patent: Oct. 20, 2009

(54) LOW-MAINTENANCE COATINGS

(75) Inventors: Annette J. Krisko, Sauk City, WI (US); Kari Myli, Sauk City, WI (US); Gary L. Pfaff, Cazenovia, WI (US); James Brownlee, Cazenovia, WI (US)

(73) Assignee: Cardinal CG Company, Eden Prairie, MN (US)

( * ) Notice: Subject to any disclaimer, the term of this patent is extended or adjusted under 35 U.S.C. 154(b) by 272 days.

(21) Appl. No.: 11/179,852

(22) Filed: Jul. 12, 2005

(65) Prior Publication Data

US 2006/0057401 A1 Mar. 16, 2006

Related U.S. Application Data

(60) Provisional application No. 60/659,491, filed on Mar. 7, 2005, provisional application No. 60/587,210, filed on Jul. 12, 2004.

(51) Int. Cl.
*B32B 9/00* (2006.01)
(52) U.S. Cl. ............... 428/432; 428/428; 428/701; 428/702
(58) Field of Classification Search ......... 428/428, 428/432, 446, 448, 698, 699, 701, 702
See application file for complete search history.

(56) References Cited

U.S. PATENT DOCUMENTS

| 1,256,818 | A | 2/1918 | Nile | 206/454 |
|---|---|---|---|---|
| 2,780,553 | A | 2/1957 | Pawlyk | 106/1 |
| 2,808,351 | A | 10/1957 | Colbert | 117/211 |
| 3,505,092 | A | 4/1970 | Ryan | 117/33.3 |
| 3,528,906 | A | 9/1970 | Cash, Jr. | 204/298 |
| 3,679,291 | A | 7/1972 | Apfel | 350/164 |
| 3,727,666 | A | 4/1973 | Vander Sluis | 164/72 |
| 3,829,197 | A | 8/1974 | Thelen | 359/588 |
| 3,840,451 | A | 10/1974 | Golyanov | 204/192 |
| 3,844,924 | A | 10/1974 | Cunningham | 204/298 |
| 3,852,098 | A | 12/1974 | Bloss | 117/106 |
| 3,854,796 | A | 12/1974 | Thelen | 359/588 |
| 3,925,182 | A | 12/1975 | Carmichael | 204/192 |
| 3,934,961 | A | 1/1976 | Itoh | 359/586 |
| 3,968,018 | A | 7/1976 | Lane | 204/192 |
| 3,970,037 | A | 7/1976 | Sopko | 118/48 |
| 3,990,784 | A | 11/1976 | Gelber | 350/166 |
| 4,029,566 | A | 6/1977 | Brandmair | 204/290.08 |
| 4,045,125 | A | 8/1977 | Farges | 350/166 |
| 4,052,520 | A | 10/1977 | Chang | 427/164 |
| 4,060,660 | A | 11/1977 | Carlson | 428/408 |
| 4,107,350 | A | 8/1978 | Berg | 427/38 |
| 4,130,672 | A | 12/1978 | Onoki | 427/164 |
| 4,166,018 | A | 8/1979 | Chapin | 204/192.12 |
| 4,194,022 | A | 3/1980 | Gillery | 427/109 |

(Continued)

FOREIGN PATENT DOCUMENTS

CA 2290999 5/1998

(Continued)

OTHER PUBLICATIONS

Spectrum Response of the Vacuum-Deposited SiO$_2$/TiO$_2$ Multilayer Film With Improved Photo-Catalytic Activity, *Journal of Materials Science Letters 20, 2001*, pp. 2137-2140.

(Continued)

*Primary Examiner*—Timothy M Speer
(74) *Attorney, Agent, or Firm*—Fredrikson & Byron, PA (57) ABSTRACT

The invention provides a substrate bearing a low-maintenance coating. The coating includes at least two films: a base film optionally comprising silica (e.g., silicon dioxide) and a film comprising titania (e.g., titanium dioxide). The invention also provides methods of depositing such coatings.

17 Claims, 5 Drawing Sheets

U.S. PATENT DOCUMENTS

| | | | |
|---|---|---|---|
| 4,212,663 A | 7/1980 | Aslami | 65/144 |
| 4,212,903 A | 7/1980 | Schnell | 427/127 |
| 4,214,014 A | 7/1980 | Hofer | 427/40 |
| 4,216,259 A | 8/1980 | Groth | 428/216 |
| 4,238,276 A | 12/1980 | Kinugawa | 156/634 |
| 4,252,629 A | 2/1981 | Bewer | 204/290.03 |
| 4,261,722 A | 4/1981 | Novak | 65/60 |
| 4,322,276 A | 3/1982 | Meckel | 204/192.26 |
| 4,332,922 A | 6/1982 | Kossmehl | 525/478 |
| 4,336,119 A | 6/1982 | Gillery | 204/192.13 |
| 4,351,861 A | 9/1982 | Henery | 428/255.1 |
| 4,377,613 A | 3/1983 | Gordon | 428/212 |
| 4,422,917 A | 12/1983 | Hayfield | 204/196.01 |
| 4,440,822 A | 4/1984 | Gordon | 428/216 |
| 4,465,575 A | 8/1984 | Love | 204/192 |
| 4,466,258 A | 8/1984 | Sando | 68/56 |
| 4,466,877 A | 8/1984 | McKelvey | 204/298.23 |
| 4,485,146 A | 11/1984 | Mizuhashi | 428/428 |
| 4,486,286 A | 12/1984 | Lewin | 204/192 |
| 4,503,125 A | 3/1985 | Nelson | 428/408 |
| 4,504,519 A | 3/1985 | Zelez | 427/39 |
| 4,568,622 A | 2/1986 | Minami | 430/51 |
| 4,569,738 A | 2/1986 | Kieser | 204/173 |
| 4,571,350 A | 2/1986 | Parker | 427/109 |
| 4,576,864 A | 3/1986 | Krautter | 428/328 |
| 4,661,409 A | 4/1987 | Kieser | 428/408 |
| 4,673,475 A | 6/1987 | Windischmann | 204/192.11 |
| 4,704,339 A | 11/1987 | Green | 428/689 |
| 4,713,311 A | 12/1987 | Senske | 430/127 |
| 4,717,622 A | 1/1988 | Kurokawa | 428/408 |
| 4,725,345 A | 2/1988 | Sakamoto | 204/192.31 |
| 4,728,529 A | 3/1988 | Etzkorn | 427/39 |
| 4,732,454 A | 3/1988 | Saito | 350/164 |
| 4,737,252 A | 4/1988 | Hoffman | 204/192.16 |
| 4,769,291 A | 9/1988 | Belkind | 428/630 |
| 4,777,090 A | 10/1988 | Ovshinsky | 428/408 |
| 4,780,334 A | 10/1988 | Ackerman | 427/248.1 |
| 4,798,660 A | 1/1989 | Ermer | 204/192.17 |
| 4,814,056 A | 3/1989 | Welty | 204/298.11 |
| 4,816,127 A | 3/1989 | Eltouky | 204/192.15 |
| 4,849,081 A | 7/1989 | Ross | 204/192.15 |
| 4,851,095 A | 7/1989 | Scobey | 204/192.12 |
| 4,859,493 A | 8/1989 | Lemelson | 427/451 |
| 4,861,680 A | 8/1989 | Meyer | 428/623 |
| 4,882,827 A | 11/1989 | Kusumi | 29/527.2 |
| 4,894,133 A | 1/1990 | Hedgcoth | 204/192.15 |
| 4,915,977 A | 4/1990 | Okamoto | 427/37 |
| 4,919,778 A | 4/1990 | Dietrich | 204/192.15 |
| 4,931,778 A | 6/1990 | Guajardo | 340/664 |
| 4,952,430 A | 8/1990 | Bowser | 428/34 |
| 4,961,958 A | 10/1990 | Desphandey | 427/38 |
| 4,981,568 A | 1/1991 | Taranko | 204/192.31 |
| 5,006,248 A | 4/1991 | Anderson | 210/500.25 |
| 5,008,002 A | 4/1991 | Uno | 204/192.31 |
| 5,020,288 A | 6/1991 | Swensen | 52/202 |
| 5,026,415 A | 6/1991 | Yamamoto | 65/305 |
| 5,032,421 A | 7/1991 | Sarma | 427/38 |
| 5,035,784 A | 7/1991 | Anderson | 204/158.14 |
| 5,047,131 A | 9/1991 | Wolfe | 204/192.23 |
| 5,071,206 A | 12/1991 | Hood | 359/360 |
| 5,073,241 A | 12/1991 | Watanabe | 204/192.15 |
| 5,073,450 A | 12/1991 | Nietering | 428/336 |
| 5,090,985 A | 2/1992 | Soubeyrand | 65/60.52 |
| 5,104,539 A | 4/1992 | Anderson | 210/500.25 |
| 5,105,310 A | 4/1992 | Dickey | 359/586 |
| 5,106,671 A | 4/1992 | Amberger | 428/215 |
| 5,107,643 A | 4/1992 | Swensen | 52/202 |
| 5,108,574 A | 4/1992 | Kirs | 208/298.22 |
| 5,126,218 A | 6/1992 | Clarke | 429/245 |
| RE34,035 E | 8/1992 | Dimigen | 428/244 |
| 5,139,633 A | 8/1992 | Kashida | 204/192.15 |
| 5,165,972 A | 11/1992 | Porter | 428/1 |
| 5,171,414 A | 12/1992 | Amberger | 204/192.26 |
| 5,190,807 A | 3/1993 | Kimock | 428/216 |
| 5,194,990 A | 3/1993 | Boulos | 359/587 |
| 5,196,400 A | 3/1993 | Chen | 505/476 |
| 5,201,926 A | 4/1993 | Szczyrbowski | 65/60.2 |
| 5,209,996 A | 5/1993 | Kashida | 430/5 |
| 5,211,759 A | 5/1993 | Zimmermann | 118/723 |
| 5,245,468 A | 9/1993 | Demiryont | 359/359 |
| 5,254,392 A | 10/1993 | Burns | 428/212 |
| 5,284,539 A | 2/1994 | McKernan | 156/154 |
| 5,286,524 A | 2/1994 | Slutz | 427/249 |
| 5,302,449 A | 4/1994 | Eby | 428/336 |
| 5,306,547 A | 4/1994 | Hood | 428/213 |
| 5,318,830 A | 6/1994 | Takamatsu | 428/246 |
| 5,338,422 A | 8/1994 | Belkind | 204/192.12 |
| 5,342,676 A | 8/1994 | Zagdoun | 428/216 |
| 5,346,600 A | 9/1994 | Nieh | 204/192.3 |
| 5,354,446 A | 10/1994 | Kida | 204/298.22 |
| 5,356,718 A | 10/1994 | Athey | 428/428 |
| 5,366,764 A | 11/1994 | Sunthankar | 427/248.1 |
| 5,378,527 A | 1/1995 | Nakanishi | 428/216 |
| 5,394,269 A | 2/1995 | Takamatsu | 359/580 |
| 5,401,543 A | 3/1995 | O'Neill | 427/580 |
| 5,405,517 A | 4/1995 | Lampkin | 204/192.12 |
| 5,415,756 A | 5/1995 | Wolfe | 204/192.23 |
| 5,424,130 A | 6/1995 | Nakanishi | 428/410 |
| 5,453,459 A | 9/1995 | Roberts | 524/123 |
| 5,470,661 A | 11/1995 | Bailey | 428/408 |
| 5,476,713 A | 12/1995 | Abiko | 428/332 |
| 5,482,602 A | 1/1996 | Cooper | 204/192.11 |
| 5,498,475 A | 3/1996 | Takigawa | 428/334 |
| 5,507,930 A | 4/1996 | Yamashita | 204/192.15 |
| 5,514,485 A | 5/1996 | Ando | 428/702 |
| 5,520,996 A | 5/1996 | Balian | 428/216 |
| 5,529,631 A | 6/1996 | Yoshikawa | 118/78 |
| 5,558,751 A | 9/1996 | Mahler | 204/298.26 |
| 5,569,362 A | 10/1996 | Lerbet | 204/192.16 |
| 5,569,501 A | 10/1996 | Bailey | 427/577 |
| 5,589,280 A | 12/1996 | Gibbons | 428/626 |
| 5,593,784 A | 1/1997 | Chinzi | 428/413 |
| 5,593,786 A | 1/1997 | Parker | 428/426 |
| 5,594,585 A | 1/1997 | Komatsu | 359/512 |
| 5,595,813 A | 1/1997 | Ogawa | 428/212 |
| 5,595,825 A | 1/1997 | Guiselin | 428/428 |
| 5,597,622 A | 1/1997 | Zoller | 427/563 |
| 5,599,422 A | 2/1997 | Adams | 156/510 |
| 5,605,609 A | 2/1997 | Ando | 204/192.23 |
| 5,609,924 A | 3/1997 | McCurdy | 427/475 |
| 5,611,899 A | 3/1997 | Maass | 204/298.08 |
| 5,616,225 A | 4/1997 | Sieck | 204/298.14 |
| 5,618,388 A | 4/1997 | Seeser | 204/192.12 |
| 5,618,590 A | 4/1997 | Naruse | 427/528 |
| 5,620,572 A | 4/1997 | Bjornard | 204/192.12 |
| 5,624,423 A | 4/1997 | Anjur | 604/385.21 |
| 5,624,760 A | 4/1997 | Collins | 428/426 |
| 5,633,208 A | 5/1997 | Ishikawa | 438/699 |
| 5,643,423 A | 7/1997 | Kimock | 204/192.35 |
| 5,643,432 A | 7/1997 | Qiu | 205/50 |
| 5,645,699 A | 7/1997 | Sieck | 204/192.12 |
| 5,645,900 A | 7/1997 | Ong | 427/571 |
| 5,669,144 A | 9/1997 | Hahn | 30/346.54 |
| 5,674,625 A | 10/1997 | Takahashi | 428/428 |
| 5,674,658 A | 10/1997 | Burberry | 430/262 |
| 5,679,431 A | 10/1997 | Chen | 428/65.3 |
| 5,683,560 A | 11/1997 | Szczyrbowski | 204/298.23 |
| 5,683,561 A | 11/1997 | Hollars | 204/298 |
| 5,698,262 A | 12/1997 | Soubeyrand | 427/255.3 |
| 5,723,172 A | 3/1998 | Sherman | 427/109 |
| 5,733,660 A | 3/1998 | Makita | 428/426 |
| 5,733,669 A | 3/1998 | Veyhl | 428/698 |
| 5,745,291 A | 4/1998 | Jenkinson | 359/586 |
| 5,755,867 A | 5/1998 | Chikuni | 106/287.16 |

| | | | | | | | | |
|---|---|---|---|---|---|---|---|---|
| 5,762,674 | A | 6/1998 | Maltby, Jr. ............... 65/60.1 | 6,403,686 | B1 | 6/2002 | Pickett ................. 524/431 |
| 5,763,087 | A | 6/1998 | Falabella ............... 428/408 | 6,413,581 | B1 | 7/2002 | Greenberg ............ 427/226 |
| 5,780,119 | A | 7/1998 | Dearnaley ............. 427/528 | 6,414,213 | B2 | 7/2002 | Ohmori ................ 502/350 |
| 5,780,149 | A | 7/1998 | McCurdy ................ 428/336 | 6,425,670 | B1 | 7/2002 | Komatsu ............. 359/507 |
| 5,780,380 | A | 7/1998 | Endoh ................... 502/300 | 6,447,123 | B2 | 9/2002 | Tonar ................... 359/604 |
| 5,789,040 | A | 8/1998 | Martinu ................. 427/575 | 6,451,178 | B2 | 9/2002 | Szczyrbowski ........ 204/192.13 |
| 5,811,191 | A | 9/1998 | Neuman ................. 428/427 | 6,461,686 | B1 | 10/2002 | Vanderstraeten ........ 427/453 |
| 5,814,196 | A | 9/1998 | Hollars ................ 204/298.15 | 6,465,088 | B1 | 10/2002 | Talpaert ............... 428/307.3 |
| 5,820,994 | A | 10/1998 | Gotoh ................... 428/451 | 6,468,402 | B1 | 10/2002 | Vanderstraeten ........ 204/192.15 |
| 5,830,252 | A | 11/1998 | Finley ................... 65/60.5 | 6,488,824 | B1 | 12/2002 | Hollars .............. 204/192.22 |
| 5,830,327 | A | 11/1998 | Kolenkow ............ 204/192.12 | 6,511,587 | B2 | 1/2003 | Vanderstraeten ....... 204/298.13 |
| 5,830,332 | A | 11/1998 | Babich ................ 204/192.15 | 6,570,709 | B2 | 5/2003 | Katayama ............ 359/586 |
| 5,846,613 | A | 12/1998 | Neuville ................ 427/575 | 6,635,155 | B2 | 10/2003 | Miyamura ............ 204/192.13 |
| 5,849,200 | A | 12/1998 | Heller ................... 210/748 | 6,660,365 | B1 | 12/2003 | Krisko ................ 428/149 |
| 5,853,866 | A | 12/1998 | Watanabe ............... 428/312.8 | 6,677,063 | B2 | 1/2004 | Finley ................ 428/701 |
| 5,854,708 | A | 12/1998 | Komatsu ................ 359/512 | 6,679,978 | B2 | 1/2004 | Johnson ............ 204/192.22 |
| 5,866,199 | A | 2/1999 | Swidler ................. 427/154 | 6,680,135 | B2 | 1/2004 | Boire ................. 428/702 |
| 5,866,260 | A | 2/1999 | Adams, Jr. ............. 428/426 | 6,682,773 | B2 | 1/2004 | Medwick et al. ......... 427/154 |
| 5,869,187 | A | 2/1999 | Nakamura ................ 428/428 | 6,720,066 | B2 | 4/2004 | Talpaert ............. 428/307.3 |
| 5,869,808 | A | 2/1999 | Hyllberg ................. 219/216 | 6,777,091 | B2 | 8/2004 | Kijima ................ 428/428 |
| 5,871,843 | A | 2/1999 | Yoneda ................. 428/337 | 6,789,906 | B2 | 9/2004 | Tonar ................. 359/604 |
| 5,873,203 | A | 2/1999 | Thiel ..................... 52/172 | 6,800,183 | B2 | 10/2004 | Takahashi ............ 204/298.28 |
| 5,874,701 | A | 2/1999 | Watanabe ................ 204/157.1 | 6,818,309 | B1 | 11/2004 | Talpaert ............. 428/432 |
| 5,888,593 | A | 3/1999 | Petrmichl ................ 427/563 | 6,829,084 | B2 | 12/2004 | Takaki ................ 359/359 |
| 5,891,556 | A | 4/1999 | Anderson ................ 428/216 | 6,833,089 | B1 | 12/2004 | Kawahara ............ 428/212 |
| 5,935,716 | A | 8/1999 | McCurdy ................. 428/428 | 6,875,319 | B2 | 4/2005 | Nadaud ............... 204/192.1 |
| 5,939,194 | A | 8/1999 | Hashimoto ................ 428/411 | 6,964,731 | B1 | 11/2005 | Krisko | |
| 5,961,843 | A | 10/1999 | Hayakawa ................ 210/748 | 2001/0007715 | A1 | 7/2001 | Toyoshima ............. 428/426 |
| 5,965,246 | A | 10/1999 | Guiselin ................. 428/212 | 2001/0016262 | A1 | 8/2001 | Toyoshima ............ 204/192.12 |
| 5,968,328 | A | 10/1999 | Teschner ................ 204/298.25 | 2002/0014634 | A1 | 2/2002 | Koyama ............... 257/192 |
| 5,972,184 | A | 10/1999 | Hollars ................. 204/298.08 | 2002/0155265 | A1 | 10/2002 | Choi ................. 428/212 |
| 6,013,372 | A | 1/2000 | Hayakawa ............... 428/411.1 | 2002/0155299 | A1 | 10/2002 | Harris ................ 428/428 |
| 6,027,766 | A | 2/2000 | Greenberg ............... 427/226 | 2003/0039843 | A1 | 2/2003 | Johnson ............. 428/432 |
| 6,037,289 | A | 3/2000 | Chopin ................... 502/2 | 2003/0043464 | A1 | 3/2003 | Dannenberg ............ 359/585 |
| 6,045,903 | A | 4/2000 | Seino .................... 428/331 | 2003/0064231 | A1 | 4/2003 | Hurst ................ 428/432 |
| 6,054,227 | A | 4/2000 | Greenberg ............... 428/701 | 2003/0143437 | A1 | 7/2003 | Ohtsu ................ 428/701 |
| 6,068,914 | A | 5/2000 | Boire .................... 428/216 | 2003/0186089 | A1 | 10/2003 | Kikuchi .............. 428/701 |
| 6,071,606 | A | 6/2000 | Yamazaki ................ 428/325 | 2003/0207028 | A1 | 11/2003 | Boire ................. 427/226 |
| 6,071,623 | A | 6/2000 | Sugawara ................ 428/428 | 2003/0235695 | A1 | 12/2003 | Greenberg ............. 428/432 |
| 6,074,981 | A | 6/2000 | Tada ..................... 502/224 | 2004/0020761 | A1 | 2/2004 | Thomsen ............. 204/192.12 |
| 6,090,489 | A | 7/2000 | Hayakawa ............... 428/409 | 2004/0032655 | A1 | 2/2004 | Kikuchi ............... 359/444 |
| 6,103,363 | A | 8/2000 | Boire ..................... 428/325 | 2004/0063320 | A1 | 4/2004 | Hollars .............. 438/689 |
| 6,114,043 | A | 9/2000 | Joret .................... 428/428 | 2004/0180220 | A1 | 9/2004 | Gueneau ............... 428/446 |
| 6,124,044 | A | 9/2000 | Swidler ................. 428/500 | 2005/0016835 | A1 | 1/2005 | Krisko | |
| 6,154,311 | A | 11/2000 | Simmons, Jr. ........... 359/359 | 2005/0020444 | A1 | 1/2005 | Hiraoka ............... 502/350 |
| 6,156,171 | A | 12/2000 | Hollars ................ 204/298.25 | 2005/0025982 | A1 | 2/2005 | Krisko | |
| 6,156,409 | A | 12/2000 | Doushita ................ 428/143 | 2005/0221098 | A1 | 10/2005 | Azzopardi ............ 428/446 |
| 6,165,256 | A | 12/2000 | Hayakawa ................ 106/13 | 2005/0233899 | A1 | 10/2005 | Anzaki ................ 502/350 |
| 6,165,598 | A | 12/2000 | Nelson ................... 428/212 | 2006/0014050 | A1 | 1/2006 | Gueneau ............... 428/702 |
| 6,165,616 | A | 12/2000 | Lemelson ................. 428/408 | 2006/0051597 | A1 | 3/2006 | Anzaki ................ 428/432 |
| 6,171,659 | B1 | 1/2001 | Vanden Brande ............ 427/523 | 2006/0105103 | A1 | 5/2006 | Hartig | |
| 6,191,062 | B1 | 2/2001 | Hayakawa ............... 502/159 | 2006/0121315 | A1 | 6/2006 | Myli | |
| 6,193,378 | B1 | 2/2001 | Tonar .................... 359/603 | 2007/0264494 | A1* | 11/2007 | Krisko et al. ........... 428/336 |
| 6,193,856 | B1 | 2/2001 | Kida .................... 204/192.22 | | | | |
| 6,197,101 | B1 | 3/2001 | Matsumura ............ 106/287.11 | | | FOREIGN PATENT DOCUMENTS | |
| 6,210,750 | B1 | 4/2001 | Cho ...................... 427/190 | DE | | 43 13 284 | 10/1994 |
| 6,210,779 | B1 | 4/2001 | Watanabe ............... 428/208 | DE | | 19736925 | 3/1998 |
| 6,242,752 | B1 | 6/2001 | Soma ..................... 250/504 | DE | | 19644752 | 4/1998 |
| 6,261,693 | B1 | 7/2001 | Veerasamy ................. 428/408 | DE | | 19831610 | 1/1999 |
| 6,270,633 | B1 | 8/2001 | Onaka .................. 204/192.12 | DE | | 10100221 | 7/2001 |
| 6,299,981 | B1 | 10/2001 | Azzopardi ................ 428/429 | DE | | 10100223 | 7/2001 |
| 6,319,326 | B1 | 11/2001 | Koh ..................... 118/718 | EP | | 0 207 646 | 1/1987 |
| 6,326,079 | B1 | 12/2001 | Philippe ................. 428/325 | EP | | 0 470 379 A | 2/1992 |
| 6,333,084 | B1 | 12/2001 | Woodard ................. 428/34 | EP | | 0 279 550 | 4/1993 |
| 6,334,938 | B2 | 1/2002 | Kida .................... 204/298.13 | EP | | 0 369 581 B | 12/1993 |
| 6,350,397 | B1 | 2/2002 | Heikkila ................. 264/39 | EP | | 0 590 477 | 4/1994 |
| 6,352,755 | B1 | 3/2002 | Finley .................... 428/100 | EP | | 0 601 928 | 6/1994 |
| 6,354,109 | B1 | 3/2002 | Boire .................... 65/60.1 | EP | | 0 611 733 | 8/1994 |
| 6,362,121 | B1 | 3/2002 | Chopin .................... 502/2 | EP | | 0 515 847 B1 | 2/1995 |
| 6,365,010 | B1 | 4/2002 | Hollars ................ 204/192.12 | EP | | 0 636 702 | 2/1995 |
| 6,379,746 | B1 | 4/2002 | Birch .................... 427/154 | EP | | 0 637 572 | 2/1995 |
| 6,379,776 | B1 | 4/2002 | Tada ..................... 428/149 | EP | | 0 639 655 | 2/1995 |
| 6,387,844 | B1 | 5/2002 | Fujishima ................ 502/350 | | | | |

| | | |
|---|---|---|
| EP | 0 657 562 | 6/1995 |
| EP | 0 689 096 A | 12/1995 |
| EP | 0 689 962 A | 1/1996 |
| EP | 0 737 513 | 10/1996 |
| EP | 0 328 257 A | 4/1997 |
| EP | 0 787 696 | 8/1997 |
| EP | 0 820 967 A | 1/1998 |
| EP | 0 771 766 | 9/1998 |
| EP | 0 753 882 | 11/1998 |
| EP | 0 884 288 | 12/1998 |
| EP | 0 799 255 | 2/1999 |
| EP | 0 901 991 | 3/1999 |
| EP | 0 838 535 | 2/2000 |
| EP | 0 850 203 | 1/2001 |
| EP | 0 850 204 | 12/2001 |
| EP | 0 944 557 | 11/2002 |
| EP | 1 254 870 | 11/2002 |
| EP | 0 737 513 | 9/2003 |
| EP | 0 887 104 | 11/2003 |
| EP | 1 375 444 | 1/2004 |
| EP | 1 411 386 | 4/2004 |
| EP | 1 074 525 | 9/2004 |
| EP | 1 466 665 A | 10/2004 |
| EP | 1 500 634 | 1/2005 |
| EP | 1 518 836 | 3/2005 |
| EP | 1 640 149 | 3/2006 |
| FR | 2699164 | 2/1995 |
| FR | 2738812 | 3/1997 |
| FR | 2738813 | 3/1997 |
| FR | 2738836 | 3/1997 |
| FR | 2800731 | 5/2001 |
| FR | 2814094 | 3/2002 |
| FR | 2838734 | 10/2003 |
| FR | 2838735 | 10/2003 |
| FR | 2857885 | 1/2005 |
| FR | 2861385 | 4/2005 |
| FR | 2861386 | 4/2005 |
| FR | 2869897 | 11/2005 |
| GB | 0232680 | 4/1925 |
| GB | 1231280 | 5/1971 |
| GB | 1438462 | 6/1976 |
| GB | 2028376 | 3/1980 |
| GB | 1595061 | 8/1981 |
| GB | 2201428 | 2/1988 |
| GB | 2316687 | 8/1997 |
| GB | 2327428 | 7/1998 |
| JP | 57-140339 A | 8/1982 |
| JP | 60081048 A | 5/1985 |
| JP | 61-091042 A | 5/1986 |
| JP | 62-161945 A | 7/1987 |
| JP | 01-014129 A | 1/1989 |
| JP | 01-118807 A | 5/1989 |
| JP | 3-122274 A | 5/1991 |
| JP | 3-187039 A | 8/1991 |
| JP | 3-193872 A | 8/1991 |
| JP | 7-149545 A | 6/1995 |
| JP | 7-215074 A | 8/1995 |
| JP | 7-233469 A | 9/1995 |
| JP | 7-508491 A | 9/1995 |
| JP | 7-315874 A | 12/1995 |
| JP | 7-315889 A | 12/1995 |
| JP | 8-011631 A | 1/1996 |
| JP | 8-012378 A | 1/1996 |
| JP | 8-109043 A | 4/1996 |
| JP | 8-134638 A | 5/1996 |
| JP | 8-227006 A | 9/1996 |
| JP | 9-189801 A | 7/1997 |
| JP | 9-202651 A | 8/1997 |
| JP | 9-249967 A | 9/1997 |
| JP | 10-36144 A | 2/1998 |
| JP | 10-048805 A | 2/1998 |
| JP | 11-095014 A | 4/1999 |
| WO | WO 87/06626 | 11/1987 |
| WO | WO 92/17621 A | 10/1992 |
| WO | WO 96/25534 | 8/1996 |
| WO | WO 97/03763 | 2/1997 |
| WO | WO 97/07066 | 2/1997 |
| WO | WO 97/07069 | 2/1997 |
| WO | WO 97/08359 | 3/1997 |
| WO | WO 97/10185 | 3/1997 |
| WO | WO 97/10186 | 3/1997 |
| WO | WO 97/11916 | 4/1997 |
| WO | WO 97/15499 | 5/1997 |
| WO | WO 97/25201 | 7/1997 |
| WO | WO 97/37946 | 10/1997 |
| WO | WO 97/42351 | 11/1997 |
| WO | WO 97/42357 | 11/1997 |
| WO | WO 98/06675 | 2/1998 |
| WO | WO 98/23549 | 6/1998 |
| WO | WO 98/25700 | 6/1998 |
| WO | WO 00/13257 | 3/2000 |
| WO | WO 00/37376 | 6/2000 |
| WO | WO 00/37377 | 6/2000 |
| WO | W0 00/50354 | 8/2000 |
| WO | WO 00/75087 | 12/2000 |
| WO | WO 01/02496 | 1/2001 |
| WO | WO 01/32578 | 5/2001 |
| WO | WO 01/71055 | 9/2001 |
| WO | WO 03/012540 | 2/2002 |
| WO | WO 02/24971 | 3/2002 |
| WO | WO 02/085809 | 10/2002 |
| WO | WO 03/050056 | 6/2003 |
| WO | WO 03/053577 | 7/2003 |
| WO | WO 03/072849 | 9/2003 |
| WO | WO 03/080530 | 10/2003 |
| WO | WO 03/087002 | 10/2003 |
| WO | WO 03/087005 | 10/2003 |
| WO | WO 03/106732 | 12/2003 |
| WO | 2006017311 | 2/2004 |
| WO | 2004/061151 | 7/2004 |
| WO | WO 2004/067464 | 8/2004 |
| WO | WO 2004/085701 | 10/2004 |
| WO | WO 2004/108619 | 12/2004 |
| WO | WO 2004/113064 | 12/2004 |
| WO | WO 2005/000758 | 1/2005 |
| WO | WO 2005/000759 | 1/2005 |
| WO | WO 2005/009914 | 2/2005 |
| WO | WO 2005/012593 | 2/2005 |
| WO | WO 2005/040056 | 5/2005 |
| WO | WO 2005/040058 | 5/2005 |
| WO | WO 2005/102953 | 11/2005 |
| WO | WO 2005/110937 | 11/2005 |
| WO | 2006017349 | 2/2006 |

OTHER PUBLICATIONS

Anderson et al., "Improved Photocatalytic Activity and Characterization of Mixed TiO$_2$/SiO$_2$ and TiO$_2$/Al$_2$O$_3$ Materials", *J. Phys. Chem.*, 1997, 101, 2611-2616.

Anderson et al., "An Improved Photocatalyst of TiO$_2$/SiO$_2$ prepared by a Sol-Gel Synthesis", *J. Phys. Chem.*, 1995, 99, 9882-9885.

Chen Wen-mei et al, "The Effect of SiO$_2$ Additive on Superhydrophilic Property of TiO$_2$-SiO$_2$ Thin Film by Sol-gel Method", *Journal of Wuhan University of Technology-Mater. Sci. Ed.* (Sep. 2001), vol. 16, No. 3, 30-33.

Guan et al, "Enhanced effect and mechanism of SiO$_2$ addition in super-hydrophilic property of TiO$_2$ films" *Surf and Coating Tech 173* (2003) pp. 219-223.

Guan, "Relationship between photocatalytic activity, hydrophilicity and self-cleaning effect of TiO$_2$/SiO$_2$ films" *Surf. and Coating Tech 191* (2005) pp. 155-160.

Guan, "Hydrophilic property of TiO$_2$/SiO$_2$ mixing films" *Trans. Nonferrous Met. Soc. China* (2004), vol. 14, No. 2, pp. 251-254.

Ingo et al., "XPS studies of SiO$_2$—TiO$_2$ powders prepared by sol-gel process", *Appl. Surf. Sci.* 1993, 70/71A, pp. 230-234.

Lassaletta et al., "Spectroscopic Characterization of Quantum-Sized $TiO_2$ Supported on Silica: Influence of Size and $TiO_2$-$SiO_2$ Interface Composition", *J. Phys. Chem.*, 1995, 99, 484-1490.

Matthews et al., "An Adsorption Water Purifier with in Situ Photocatalytic Regeneration", *J. Catal.* 1988, 113, pp. 549-555.

Minero et al., "Role of Adsorption in Photocatalyzed Reactions of Organic Molecules in Aqueous of $TiO_2$ Suspensions", *Langmuir*, 1992, 113, pp. 481-486.

Miyashita, et al., "Enhanced Effect of Vacuum-deposited SiO2 Overlayer on Photo-induced Hydrophilicity of TiO2 Film", *Journal of Materials Science 36* (2001) p. 3877-3884.

Miyashita et al., "Spectrum response of the vacuum-deposited $SiO_2$/$TiO_2$ multilayer film with improved photo-catalytic activity", *Journal of Materials Science Letters*, 2001, 20, 2137-2140.

Nakamura, et al., "Hydrophilic property of $SiO_2$/$TiO_2$ double layer films" *Photocatalytic Coatings, Panel Session*, pp. 345-350.

Niwa et al., Ammoxidation of Toluene Over $SiO_2$—$Al_2O_3$ $ZrO_2$—$SiO_2$ and $TiO_2$—$SiO_2$, *J. Catal.* 1981, 69, pp. 69-76.

Novotná, et al., "Photocatalytical $TiO_2$/$SiO_2$—PDMS layers on glass" *Photocatalytic Coatings, Panel Session*, pp. 383-387.

Ohsaki, et al., "Photocatalytic properties of $SnO_2$/$TiO_2$ multilayers" *Photocatalytic Coatings, Panel Session*, pp. 369-376.

Ramirez-Del-Solar et al., "Effect of the Method of Preparation on the Texture of $TiO_2$—$SiO_2$ Gels", *J. Non-Cryst. Solids* 1990, 121, pp. 84-89.

Salvado et al., "$TiO_2$—$SiO_2$ glasses prepared by the alkoxide route", *J. Non-Cryst. Solids* 1992, 147/148, pp. 256-261.

Satoh et al., "Sol-gel-derived binary silica glasses with high refractive index", *J. Non-Cryst. Solids* 1992, 146, pp. 121-128.

Schraml-Marth et al., "Porous silica gels and $TiO_2$—$SiO_2$ mixed oxides prepared via the sol-gel process: characterization by spectroscopic techniques", *J. Non-Cryst. Solids* 1992, 143, pp. 93-111.

Shibata, K., et al., "Acidic Properties of Binary Metal Oxides", *Bull. Chem. Soc. Jpn.* 1973, 46, pp: 2985-2988.

Stakheev, et al., "XPS and XAES Study of $TiO_2$—$SiO_2$ Mixed Oxide System", *J. Phys. Chem.* 1993, 97, pp. 5668-5672.

Takeuchi, et al., "Preparation of Titanium-Silicon Binary Oxide Thin Film Photocatalysts by an Ionized Cluster Beam Deposition Method. Their Photocatalytic Activity and Photoinduced Super-Hydrophilicity", *J. Phys. Chem.* 2003, 107, pp. 14278-14282.

Yu et al., "The grain size and surface hydroxyl content of super-hydrophilic $TiO_2$—$SiO_2$ composite nanometer thin films" *J. Mat. Sci. Lett.* (2001) 20, pp. 1745-1748.

Veersamy, et al., "Optical and Electronic Properties of Amorphous Diamond." *Diamond and Related Materials*, vol. 2 (1993), pp. 782-787.

"Surface Hardening of Ceramic and Glass Materials, " *IBM Technical Disclosure Bulletin*, vol. 36, Issue 1 (Jan. 1993), p. 225.

"Surface Hardening of Ceramic and Glass Materials, " *IBM Technical Disclosure Bulletin*, vol. 36, Issue 3 (Mar. 1993), pp. 291-292.

MikroElektronick—High-rate Sputtering for Two-Sided Coating (HZS-04).

Kobayashi et al., "$V_2O_5$-$WO_3$/$TiO_2$-$SiO_2$-$SO_4^{2-}$ catalysts: Influence of active components and supports on activities in the selective catalytic reduction of NO by $NH_3$ and in the oxidation of $SO_2$" *App. Cat. B: Enviro 63.* (2006), pp. 104-113.

Abstract—Japanese Patent Publication 4-276066.

Abstract—Japanese Patent Publication 5-214525.

Abstract—Japanese Patent Publication 6-330297.

Derwent Abstract 007612002 (Abstract of JP 879697).

Abstract Japanese Patent Publication 08158048A.

* cited by examiner

LOW-MAINTENANCE COATINGS

CROSS REFERENCE TO RELATED APPLICATIONS

The present application claims priority to provisional U.S. patent application filed Jul. 12, 2004 and assigned Ser. No. 60/587,210, and provisional U.S. patent application filed Mar. 7, 2005 and assigned Ser. No. 60/659,491, the entire disclosures of which are incorporated herein by reference.

FIELD OF THE INVENTION

The present invention provides thin film coatings for glass sheets and other substrates. More particularly, the invention provides thin film coatings including film comprising titania over a base layer, such as silica. The invention also provides methods of depositing such coatings onto glass sheets and other substrates.

BACKGROUND OF THE INVENTION

For many years, it has been known that titanium dioxide can be used as a photocatalyst. A great deal of research has been done with a view toward providing coatings that have self-cleaning properties. The pursuit of self-cleaning window coatings, in particular, has been an active field of exploration. These coatings typically involve a titanium dioxide layer on a glass pane. The coatings are commonly provided with a relatively thick layer of titanium dioxide and/or a specific underlayer system designed for achieving high levels of photoactivity. Thick titanium dioxide layers, unfortunately, produce high levels of visible reflectance, thus creating a somewhat mirror-like appearance. This high visible reflection tends to exaggerate the appearance of dirt on a window. Further, some known under-layer systems teach that specific materials and crystal structures must be used for the under-layer film(s) to achieve acceptable photoactivity levels. Moreover, some known photocatalytic coatings are said to require heating during film deposition to achieve acceptable levels of photoactivity.

Known photocatalytic coatings also tend to have properties that are less than ideal for window applications. As noted above, the visible reflectance of some known photocatalytic coatings is unacceptably high. Moreover, the reflected colors of these coatings tend not to be ideal. Further, some of these coatings have particularly rough surfaces, since they are designed to have large surface areas that facilitate high photoactivity levels. These rough coatings, unfortunately, tend to be quite vulnerable to being abraded. They are also particularly susceptible to taking on and stubbornly retaining dirt and other contaminants. Finally, with some recent photocatalytic coatings (e.g., those having complex under-layer systems), it is unclear whether these coatings will exhibit the longevity (e.g., in-field durability over time) that is required for number-one-surface coatings.

The present invention provides low-maintenance coatings that offer exceptional durability, exceptional optical properties, reliable production processes, and surprising cleanliness/maintenance properties.

DETAILED DESCRIPTION OF PREFERRED EMBODIMENTS

The following detailed description is to be read with reference to the drawings, in which like elements in different drawings have like reference numerals. The drawings, which are not necessarily to scale, depict selected embodiments and are not intended to limit the scope of the invention. Skilled artisans will recognize that the given examples have many alternatives that fall within the scope of the invention.

Many embodiments of the invention involve a coated substrate. A wide variety of substrate types are suitable for use in the invention. In some embodiments, the substrate 10 is a sheet-like substrate having generally opposed first 12 and second 14 major surfaces. For example, the substrate can be a sheet of transparent material (i.e., a transparent sheet). The substrate, however, is not required to be a sheet, nor is it required to transparent.

The substrate can optionally be a component of any of a variety of building materials. Examples of anticipated applications include embodiments wherein the substrate is a sash (e.g., a window sash or a door sash), a siding panel (e.g., an aluminum siding panel), a tent panel, a tarpaulin (e.g., a fluorocarbon polymer tarpaulin), a plastic film (e.g., a fluorocarbon plastic film), a roofing shingle, a window blind (such as a metal, plastic, or paper window blind), a paper screen (e.g., a shoji), a railing, a baluster, or an escutcheon. In one embodiment, the substrate is a ceramic tile, such as a wall, ceiling, or floor tile. In another embodiment, the substrate is a glass block. A variety of suitable glass blocks can be obtained commercially from Saint-Gobain Oberland (Koblenz, Germany). In still other embodiments, the substrate is a polyester film, a polyethylene film, a terephthalate film, etc. Suitable films of this nature can be obtained commercially from Nippon Soda Co., Ltd. (Tokyo, Japan). In further embodiments, the substrate is a fence or wall, such as a noise-reduction fence or wall.

Other anticipated applications include embodiments wherein the substrate 10 is part of a sink, toilet, urinal cover, lighting fixture, a cover for a lighting fixture (e.g., a lamp cover), or another bathroom fixture or appliance. Still further, the substrate in one embodiment is a key, button, or key pad for a computer or another machine. In yet another embodiment, the substrate is an article of paper clothing (e.g., a paper-based shirt, dress, or pants for medical professionals), an article of cloth clothing, or an article of clothing of another fabric.

For many applications, the substrate will comprise a transparent (or at least translucent) material, such as glass or clear plastic. For example, the substrate is a glass sheet (e.g., a window pane) in certain embodiments. A variety of known glass types can be used, and soda-lime glass will commonly be preferred. In certain preferred embodiments, the substrate is part of a window, skylight, door, or other glazing. In some cases, the substrate is part of an automobile windshield, an automobile side window, an exterior or interior rear-view mirror, a bumper, a hubcap, a windshield wiper, or an automobile hood panel, side panel, trunk panel, or roof panel. In other embodiments, the substrate is a piece of aquarium glass, a plastic aquarium window, or a piece of greenhouse glass. In a further embodiment, the substrate is a refrigerator panel, such as part of a refrigerator door or window.

Substrates of various sizes can be used in the present invention. Commonly, large-area substrates are used. Certain embodiments involve a substrate having a major dimension (e.g., a length or width) of at least about 0.5 meter, preferably at least about 1 meter, perhaps more preferably at least about 1.5 meters (e.g., between about 2 meters and about 4 meters), and in some cases at least about 3 meters. In some embodiments, the substrate is a jumbo glass sheet having a length and/or width that is between about 3 meters and about 10 meters, e.g., a glass sheet having a width of about 3.5 meters and a length of about 6.5 meters. Substrates having a length and/or width of greater than about 10 meters are also anticipated.

In some embodiments, the substrate is a generally square or rectangular glass sheet. The substrate in these embodiments can have any of the dimensions described in the preceding paragraph and/or in the following paragraph. In one particular embodiment, the substrate is a generally rectangular glass sheet having a width of between about 3 meters and about 5 meters, such as about 3.5 meters, and a length of between about 6 meters and about 10 meters, such as about 6.5 meters.

Substrates of various thicknesses can be used in the present invention. In some embodiments, the substrate (which can optionally be a glass sheet) has a thickness of about 1-5 mm. Certain embodiments involve a substrate with a thickness of between about 2.3 mm and about 4.8 mm, and perhaps more preferably between about 2.5 mm and about 4.8 mm. In one particular embodiment, a sheet of glass (e.g., soda-lime glass) with a thickness of about 3 mm is used. In one group of embodiments, the thickness of the substrate (which can be glass, plastic, or another material) is between about 4 mm and about 20 mm. Thicknesses in this range, for example, may be useful for aquarium tanks (in which case, the substrate can optionally be glass or acrylic). When the substrate is float glass, it will commonly have a thickness of between about 4 mm and about 19 mm. In another group of embodiments, the substrate is a thin sheet (e.g., of glass) having a thickness of between about 0.35 mm and about 1.9 mm. Embodiments of this nature can optionally involve the substrate being a sheet of display glass or the like.

Figure 1:
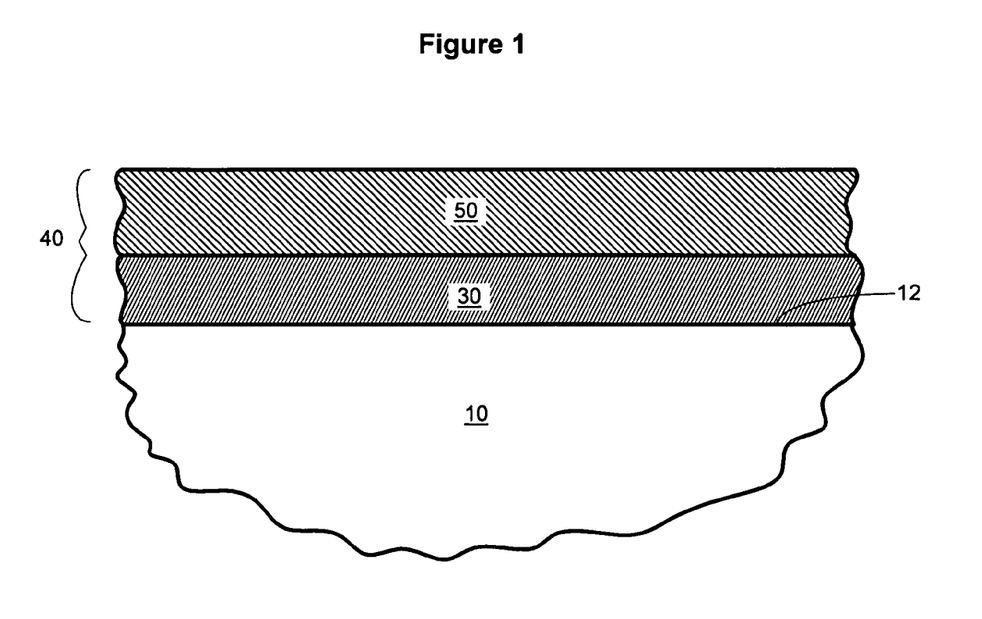
FIG. 1 is a partially broken-away schematic cross-sectional side view of a substrate bearing a low-maintenance coating in accordance with certain embodiments of the invention.

With reference to FIG. 1, in certain embodiments, the invention provides a substrate 10 bearing a low-maintenance coating 40. The coating 40 is preferably deposited over (e.g., over an entirety of) a major surface 12 of the substrate 10. The low-maintenance coating 40 includes at least two films: (1) a base film 30 deposited over a major surface 12 of the substrate 10; and (2) a titania-containing film 50 deposited over the base film 30. The term "titanium-containing" is used herein to refer to a material that includes at least some titania. Likewise, the term "silicon-containing" is used herein to refer to a material that includes at least some silicon.

In some embodiments of the present invention, the base film 30 is deposited directly over the substrate 10 (e.g., directly over a major surface 12 of the substrate). The base film 30 generally comprises any dielectric film. In preferred embodiments, this film 30 comprises, or consists essentially of, silica (e.g., silicon dioxide). When the base film 30 is a silica film, it can include small amounts of an electrically-conductive material, such as aluminum, which may be oxidized in the film 30. For example, this film 30 can be deposited by sputtering a silicon-containing target that includes a small amount of aluminum or another metal that enhances the electrical conductivity of the target. The base film 30 (an entire thickness of which may comprise or consist essentially of silica) preferably has (e.g., is deposited at) a physical thickness of less than about 300 angstroms, and more preferably less than 100 angstroms. In certain embodiments, the film 30 is less than 95 angstroms. These small thicknesses facilitate a surprisingly array of exceptional properties in the present coating.

The coating 40 includes a titania-containing film 50 that desirably is deposited directly over the base film 30. In certain embodiments, the titania-containing film 50 is deposited directly over an entirely or substantially amorphous base film. In some of these embodiments, the substrate is a glass sheet that has been subjected to a post-coating-deposition glass tempering procedure, and the base film 30 is entirely or substantially amorphous, such that the titania-containing film 50 is directly over an entirely or substantially amorphous base film.

The titania-containing film 50 can comprise one or more other materials, such as oxides of iron, silver, copper, tungsten, aluminum, zinc, strontium, palladium, gold, platinum, nickel, cobalt, or combinations thereof. Preferably a major percentage (e.g., by weight) of the film 50 is titania. In preferred embodiments, this film 50 consists essentially of, or consists of, titanium dioxide. In some embodiments, though, the film 50 consists essentially of, or consists of, substoichiometric titanium oxide ($TiO_x$, where x is less than 2). The film 50 (an entire thickness of which may consist essentially of titania) desirably has (e.g., is deposited at) a physical thickness of less than 100 angstroms. In preferred embodiments, the film 50 has a thickness of less than 50 angstroms, preferably less than 40 angstroms, and more preferably less than 35 angstroms. In one particular embodiment, the film 50 has a thickness of between about 5 angstroms and about 30 angstroms.

It has been discovered that the film 50 when provided at these very small thicknesses provides surprisingly advantageous low maintenance properties, while at the same time achieving exceptionally low visible reflection, neutral color, and exceptional durability. Moreover, in some embodiments, the film 50 is a sputtered film (optionally sputtered reactively using one or more metallic targets consisting essentially of titanium) deposited at low temperatures (e.g., sputter deposited while maintaining the substrate at less than about 250 degrees Celsius and preferably less than 200 degrees Celsius), and it is perhaps more surprising that a sputtered film of this nature exhibits such useful low-maintenance properties.

One group of embodiments provides a substrate 10 (e.g., a glass sheet) having a first major surface 12 directly over which is deposited the base film 30 at a thickness of less than about 300 angstroms, wherein the titania-containing film is deposited directly over the base film 30 at a thickness of less than 50 angstroms. In these embodiments, the base film 30 preferably comprises a dielectric material. As noted above, silica is used in some embodiments.

Certain embodiments provide a substrate 10 (e.g., a glass sheet) having a first major surface 12 directly over which is deposited a base film 30 consisting essentially of silica (e.g., $SiO_2$) at a thickness of less than 100 angstroms, wherein a titania-containing film 50 consisting essentially of titania (e.g., $TiO_2$) is deposited directly over the base film 30 at a thickness of less than 50 angstroms. In some preferred embodiments of this nature, the base film 30 has a thickness of about 90 angstroms, while the titania-containing film 50 has a thickness of about 25 angstroms. Following is an exemplary embodiment of this nature:

---
air
25 angstroms TiO2
90 angstroms SiO2
glass

---

The diagram above exemplifies one coating of a group of embodiments wherein there is provided a substrate 10 having a first major surface 12 over which is deposited the base film 30, wherein the titanium-containing film 50 is deposited directly over the base film 30, and each of these two films has a thickness of less than 100 angstroms. In the diagram above, the base film comprises silica, although this is not required in all of the present embodiments. The base film 30 in the present group of embodiments can optionally be deposited directly over the substrate.

In the present coating 40, the film 50 desirably is the outermost film of the coating. Conventional wisdom in the art would suggest that the very small thicknesses of the present coating 40 would not yield enough photoactivity to give useful properties, especially for embodiments where the film 50 is sputtered. Surprisingly, though, the present coating exhibits photoactivity levels that are believed to be advantageous for keeping windows (e.g., monolithic panes or IG units) free of particular contaminants that tend to build up on windows during the course of routine manufacturing. The present coating also exhibits advantageous water-sheeting properties, while at the same time having exceptional optical properties and durability.

Figure 2:
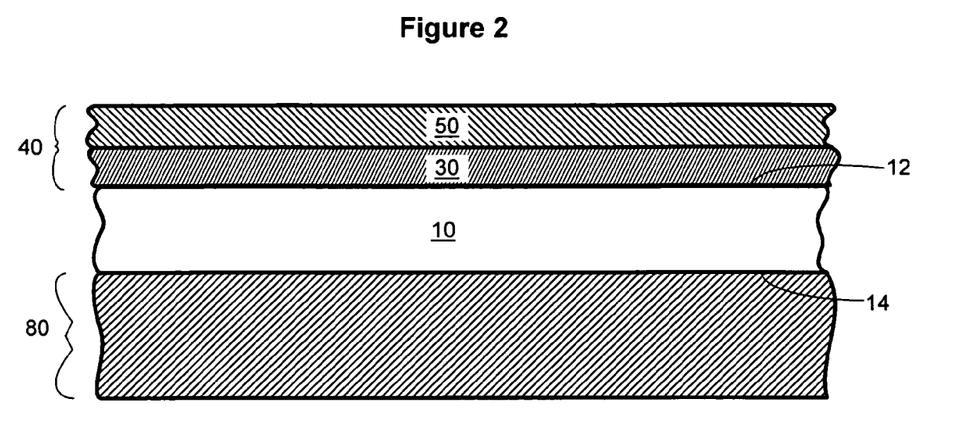
FIG. 2 is a partially broken-away schematic cross-sectional side view of a substrate bearing a low-maintenance coating and a low-emissivity coating in accordance with certain embodiments of the invention.

With reference to FIG. 2, the illustrated substrate 10 is provided with two coatings: the low-maintenance coating 40 on the first surface 12 of the substrate and a low-emissivity coating 80 on the second surface 14 of the substrate. The low-emissivity coating 80 is optional. When provided, any desired low-emissivity coating can be used. Suitable examples of a low-emissivity coating are described in U.S. patent application Ser. No. 09/728,435, entitled "Haze-Resistant Transparent Film Stacks", the entire teachings of which are incorporated herein by reference.

Figure 3:
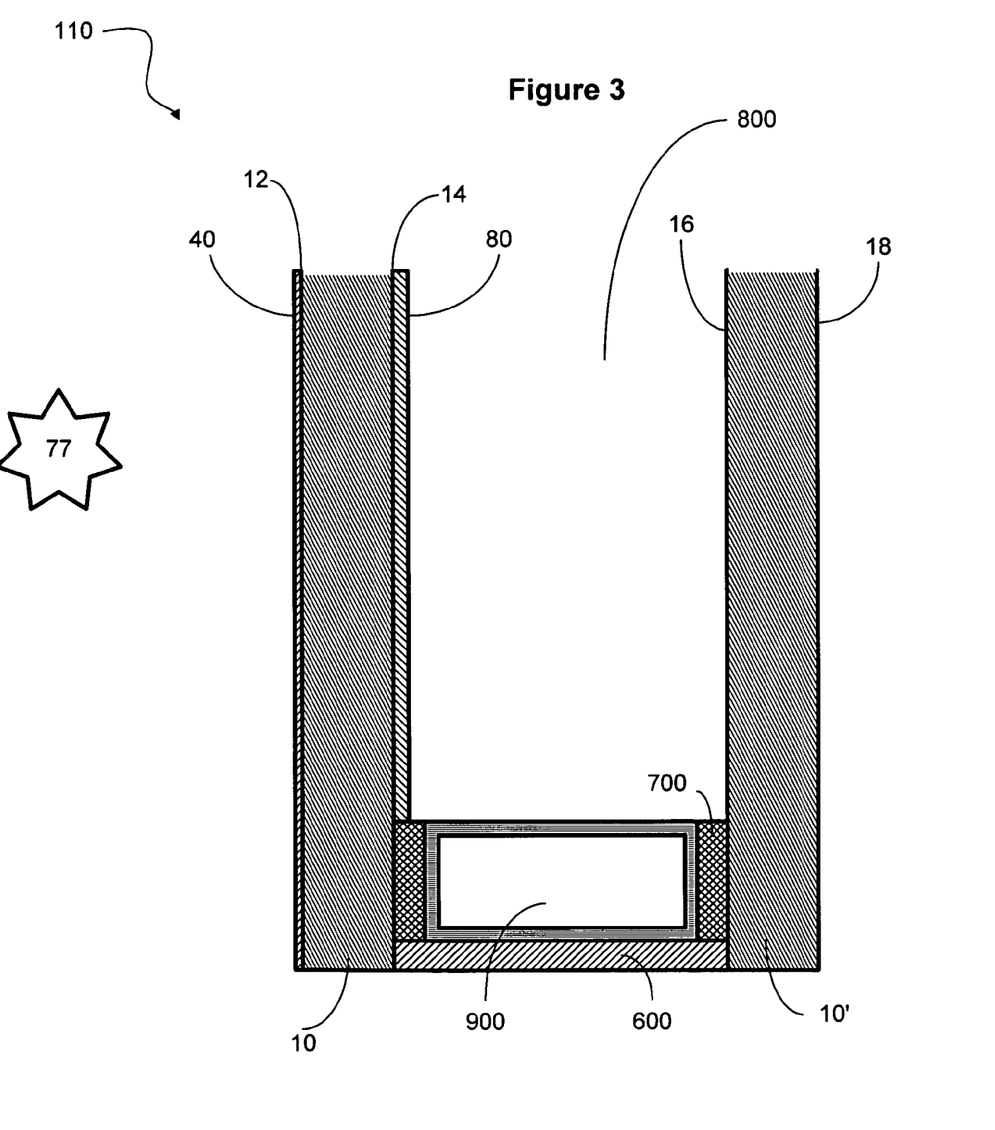
FIG. 3 is a partially broken-away schematic cross-sectional side view of an insulating glass unit incorporating a substrate bearing a low-maintenance coating and a low-emissivity coating in accordance with certain embodiments of the invention.

With reference to FIG. 3, the substrate 10 can be part of an insulating glass unit 110. Typically, an insulating glass unit 110 has an exterior pane 10 and an interior pane 10' separated by a between-pane space 800. A spacer 900 (which can optionally be part of a sash) is commonly provided to separate the panes 10 and 10'. The spacer can be secured to the interior surfaces of each pane using an adhesive 700. In some cases, an end sealant 600 is provided.

In the illustrated embodiment, the exterior pane 10 has an exterior surface 12 and an interior surface 14. The interior pane 10' has an interior surface 16 and an exterior surface 18. The pane 10 can be mounted in a frame (e.g., a window frame) such that the exterior surface 12 is exposed to an outdoor environment (e.g., such that the low maintenance coating 40 is exposed to such an environment). Interior surfaces 14 and 16 are both exposed to the atmosphere in the between-pane space 800 of the insulating glass unit. The optional low-emissivity coating 80 can be positioned on either one of the interior surfaces 14 or 16. In FIG. 3, the low-emissivity coating 80 is positioned on the interior surface 14.

Figure 4:
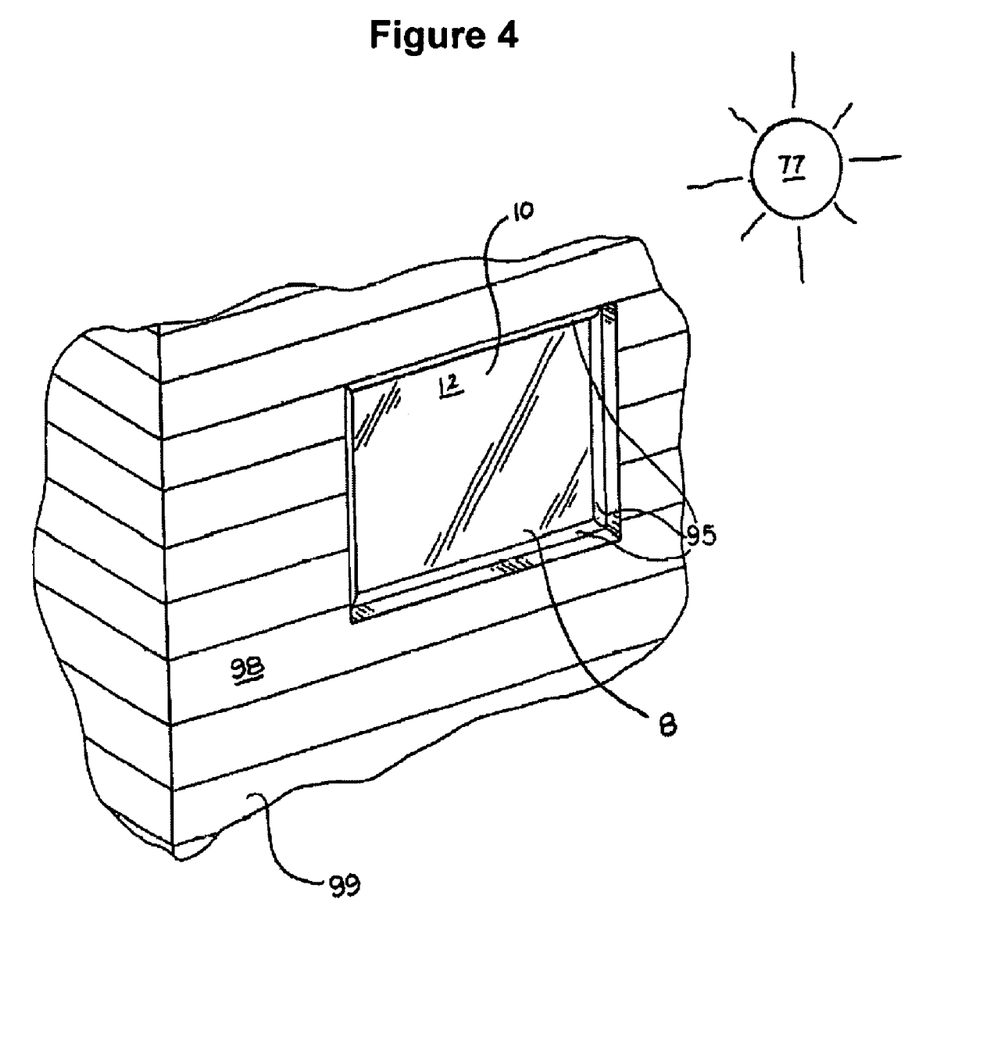
FIG. 4 is a partially broken-away perspective view of a window pane bearing a low-maintenance coating, the pane is mounted in an exterior wall of a building in accordance with certain embodiments of the invention.

With reference to FIG. 4, the low-maintenance coating 40 is preferably on the "first" surface of a window. FIG. 4 exemplifies embodiments wherein the substrate 10 (which may be a glass pane) is a window pane that is mounted on a window frame 95 (e.g., in an exterior wall 98 of a building 99). In certain applications, the coated first surface (i.e., surface 12) of such a window will be exposed to an outdoor environment (e.g., such that the coating 40 will be in periodic contact with rain). In another embodiment, the low-maintenance coating is applied to a "fourth" surface of a window (e.g., the #4 surface of a double-pane window unit), optionally in addition to providing a low-maintenance coating on the first surface of the same window. Further, in monolithic windows, the low-maintenance coating 40 can be provided on only the #1 surface, on only the #2 surface, or on both the #1 and #2 surfaces.

The invention also provides methods for producing coated substrates. These methods involve depositing the low-maintenance coating 40 (i.e., by depositing each film of any embodiment described above) upon a substrate 10. As noted above, the low-maintenance coating includes at least two films. These films 30, 50 can be deposited by a variety of well known coating techniques. In certain embodiments, the coating 40 (or at least the film 50) is deposited by sputtering, optionally at a low temperature (e.g., while maintaining the substrate at below about 250 degrees Celsius, and perhaps more preferably below 200 degrees Celsius). Alternatively, other coating techniques can be used, including chemical vapor deposition (CVD), plasma enhanced chemical vapor deposition, and pyrolytic deposition. Various embodiments of the coating 40 have been described, and the present methods involve depositing any of the described coating embodiments by any thin film deposition method.

Figure 5:
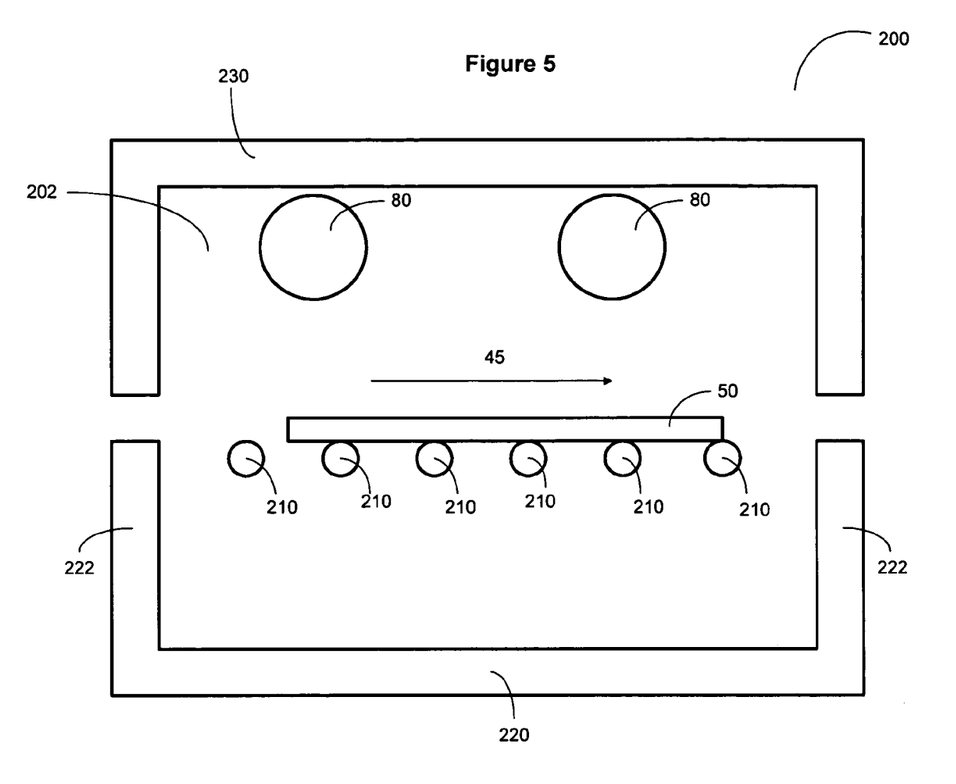
FIG. 5 is a schematic side view of a sputtering chamber that is adapted for use in certain methods of the invention.

Sputtering is well known in the present art. FIG. 5 depicts an exemplary magnetron sputtering chamber 200. Magnetron sputtering chambers and related equipment are commercially available from a variety of sources (e.g., Leybold). Useful magnetron sputtering techniques and equipment are described in U.S. Pat. No. 4,166,018, issued to Chapin, the entire teachings of which are incorporated herein by reference.

The illustrated sputtering chamber 200 includes a base (or "floor") 220, a plurality of side walls 222, and a ceiling (or "top lid" or "cover") 230, together bounding a sputtering cavity 202. In FIG. 5, two upper targets 80 are mounted above the path of substrate travel 45. Alternatively, the coating 40 can be deposited by an upward sputtering method. Either way, the substrate 10 is conveyed along the path of substrate travel 45 during film deposition, optionally over a plurality of spaced-apart transport rollers 210. In FIG. 5, two upper targets are provided, although this is by no means required. For example, a single upper or lower target could alternatively be used in each chamber. Moreover, the chamber can include one or more upper and/or lower planar targets, although cylindrical targets are shown.

As noted above, the invention provides methods of producing a coated substrate by sputter depositing onto the substrate each film of any coating embodiment described in the present disclosure. Preferably, the sputtering of the coating 40 (or at least the sputtering of the titania-containing film 50) is carried out while maintaining the substrate at a temperature of less than about 250 degrees Celsius, and more preferably less than 200 degrees Celsius (e.g., without supplemental heating of the substrate). In such cases, the coating preferably is sputter deposited without any supplemental means for delivering energy to the growing film (e.g., without any heating of the substrate beyond that which occurs normally from the plasma and ion bombardment of conventional sputtering). In other cases, the film is deposited by a sputter deposition technique that includes a supplemental heating (or other supplemental energy delivery).

In certain methods of the invention, the low-maintenance coating 40 is applied to a substrate 10 in a multiple-chamber sputtering line. Sputtering lines are well known in the present art. A typical sputtering line includes a series of coat zones, or sputtering chambers, aligned and connected such that a sheet-like substrate can be passed from one coat zone to the next by conveying the substrate horizontally over spaced-apart transport rollers 210 in each of the zones (the rollers form a continuous path of substrate travel 45 through the sputtering line). The substrate is typically conveyed at speeds of between about 100-500 inches per minute.

In one particular method, the substrate 10 is positioned at the inlet of the sputtering line and conveyed through a series of sputtering bays. Each bay is provided with one cathode having two rotatable cylindrical targets. The substrate 10 is conveyed at a rate of about 350 inches per minute, while sputtering each target at a desired power level.

First, the substrate is conveyed through five sputtering bays that are adapted to deposit the base film 30. In more detail, each bay has a cathode comprising two silicon sputtering targets. The silicon targets in these bays are sputtered in oxidizing atmosphere to deposit a silicon dioxide film directly upon the first major surface 12 of the substrate. The atmosphere in each of these bays may consist essentially of oxygen (e.g., about 100% $O_2$). Alternatively, the atmosphere may comprise $Ar/O_2$ (e.g., oxygen and up to about 40% argon). A power of about 57 kW is applied to each of these cathodes. The substrate 10 is conveyed beneath the targets at a rate of about 350 inches per minute, while sputtering each of these targets at the 57 kW power level. This results in the deposition of a silicon dioxide base film having a thickness of about 90 Å. As noted above, each silicon target may include some aluminum or another material to enhance the conductivity of the target.

The substrate is then conveyed through four more sputtering bays to deposit the titania-containing film 50. Each of these bays has a cathode comprising two titanium sputtering targets. These titanium targets are sputtered in an oxidizing atmosphere to deposit a titanium dioxide film directly upon the base film 30. The atmosphere in each such bay may consist essentially of oxygen. Alternatively, the atmosphere may comprise $Ar/O_2$. A power of about 100 kW is applied to each of these cathodes. The substrate 10 is conveyed beneath the targets at a rate of about 350 inches per minute, while sputtering each of these targets at the 100 kW power level. This results in the deposition of a titanium dioxide film having a thickness of about 25 Å. This titanium dioxide forms the outermost portion of the coating 40 (and is exposed) in the present embodiment.

In the method just described, it is to be appreciated that the second major surface 14 of the substrate 10 may previously have been, or may subsequently be, coated with an optional low-emissivity coating 80. For instance, the coat zones just described for use in depositing the base film 30 and titania-containing film 50 can be a sputter-up coat zones located toward the end of a sputtering line that includes a relatively large number of preceding sputter-down coat zones in which the optional low-emissivity coating 80 may have been applied. Particularly useful sputter-up/sputter-down methods and equipment are described in U.S. patent application Ser. No. 09/868,542, the entire contents of which are incorporated herein by reference.

While preferred embodiments of the present invention have been described, it should be understood that numerous changes, adaptations, and modifications can be made therein without departing from the spirit of the invention and the scope of the appended claims.

What is claimed is:

1. A low-maintenance coating on a substrate, the coating comprising a base film positioned directly over a first major surface of the substrate and a film comprising titania positioned directly over the base film, wherein the base film has a thickness of less than about 100 angstroms, and wherein the film comprising titania has a thickness of less than 50 angstroms.

2. The low-maintenance coating of claim 1 wherein the film comprising titania includes titanium dioxide or substoichiometric titanium oxide.

3. The low-maintenance coating of claim 1 wherein the base film comprises silica.

4. The low-maintenance coating of claim 3 wherein the base film consists essentially of silicon dioxide.

5. The low-maintenance coating of claim 1 wherein the film comprising titania has a thickness of less than 35 angstroms.

6. The low-maintenance coating of claim 1 wherein the film comprising titania has a thickness of between about 5 angstroms and about 30 angstroms.

7. The low-maintenance coating of claim 1 wherein the substrate is a window pane mounted in a window frame, and wherein the coated first major surface is exposed to an outdoor environment.

8. The low-maintenance coating of claim 1 wherein the base film and film comprising titania are both sputtered films.

9. A low-maintenance coating on a glass sheet, the coating comprising a base film positioned over a first major surface of the glass sheet and a film comprising titania positioned directly over the base film, wherein the base film comprises silica and has a thickness of less than 100 angstroms, and wherein the film comprising titania has a thickness of less than 100 angstroms.

10. The low-maintenance coating of claim 9 wherein the film comprising titania comprises titanium dioxide or substoichiometric titanium oxide.

11. The low-maintenance coating of claim 9 wherein the base film consists essentially of silicon dioxide.

12. The low-maintenance coating of claim 9 wherein the film comprising titania has a thickness of less than 50 angstroms 13. The low-maintenance coating of claim 9 wherein the film comprising titania has a thickness of less than 35 angstroms.

14. The low-maintenance coating of claim 9 wherein the film comprising titania has a thickness of between about 5 angstroms and about 30 angstroms.

15. The low-maintenance coating of claim 9 wherein the glass sheet is a window pane mounted in a window frame, and wherein the coated first major surface is exposed to an outdoor environment.

16. The low-maintenance coating of claim 9 wherein the silica base film and film comprising titania are both sputtered films.

17. An insulating glass unit comprising two spaced-apart panes bounding a between-pane space, wherein at least one of the panes has a desired major surface bearing a low-maintenance coating, wherein said desired major surface is an exterior surface of the unit and faces away from the between-pane space, the coating comprising a base film positioned directly over said desired major surface and a film comprising titania positioned directly over the base film, wherein the base film comprises silica has a thickness of less than 100 angstroms and the film comprising titania has a thickness of less than 50 angstroms.

* * * * *

UNITED STATES PATENT AND TRADEMARK OFFICE
CERTIFICATE OF CORRECTION

PATENT NO. : 7,604,865 B2 Page 1 of 1
APPLICATION NO. : 11/179852
DATED : October 20, 2009
INVENTOR(S) : Krisko et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 452 days.

Signed and Sealed this

Fifth Day of October, 2010

David J. Kappos
*Director of the United States Patent and Trademark Office*